(12) United States Patent
Lim et al.

(10) Patent No.: US 11,428,385 B2
(45) Date of Patent: Aug. 30, 2022

(54) LIGHT SOURCE MODULE AND MOBILE DEVICE INCLUDING THE SAME

(71) Applicant: SAMSUNG ELECTRONICS CO., LTD., Suwon-si (KR)

(72) Inventors: Dongsoo Lim, Seoul (KR); Chinwoo Kim, Incheon (KR); Yongchul Kang, Hwaseong-si (KR); Heejin Kim, Yongin-si (KR); Jeongje Moon, Seoul (KR); Jaeyoo Jeong, Hwaseong-si (KR); Jun Cho, Yongin-si (KR); Jongwook Ju, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/379,530

(22) Filed: Jul. 19, 2021

(65) Prior Publication Data

US 2022/0146078 A1   May 12, 2022

(30) Foreign Application Priority Data

Nov. 12, 2020 (KR) .................. 10-2020-0151265

(51) Int. Cl.
  *F21V 14/00* (2018.01)
  *F21V 33/00* (2006.01)
  *F21Y 115/10* (2016.01)

(52) U.S. Cl.
  CPC ........ *F21V 14/003* (2013.01); *F21V 33/0052* (2013.01); *F21Y 2115/10* (2016.08)

(58) Field of Classification Search
  CPC .... F21V 14/003; F21V 33/0052; F21V 14/00; F21V 14/006; F21V 33/00; F21Y 2115/10; F21S 41/64; F21S 41/645; F21S 41/63; F21S 41/60; H01L 27/3232
  See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| JP | 2013-153082 A | 8/2013 |
| KR | 2003-0085022 A | 11/2003 |

(Continued)

*Primary Examiner* — Bao Q Truong
(74) *Attorney, Agent, or Firm* — Sughrue Mion, PLLC

(57) ABSTRACT

Provided is a light source module including a package body having a groove portion, a semiconductor light emitting diode (LED) chip provided on a bottom surface of the groove portion, the semiconductor LED chip being configured to emit light based on a first driving voltage applied thereto, a variable light transmission unit provided on the groove portion and having light transmissivity varying based on a second driving voltage applied thereto, a first electrode side surface and a second electrode side surface provided on side surfaces of the groove portion and connecting the bottom surface of the groove portion to the variable light transmission unit, and a processor configured to control application of the first driving voltage to the semiconductor LED chip and the second driving voltage to the variable light transmission unit.

20 Claims, 13 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,425,065 B2 | 4/2013 | Ravillisetty et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 8,842,255 B2 * | 9/2014 | Yoo ................. H01L 33/58 349/200 |
| 8,872,213 B2 | 10/2014 | Yoshida et al. |
| 9,559,274 B2 | 1/2017 | Ota et al. |
| 2002/0171907 A1 | 11/2002 | Vincent et al. |
| 2006/0087499 A1 | 4/2006 | Chen et al. |
| 2009/0323156 A1 | 12/2009 | Shin et al. |
| 2013/0208501 A1 * | 8/2013 | Ku ...................... F21V 5/00 362/276 |
| 2016/0337564 A1 * | 11/2016 | Fournier ............ H04N 5/2252 |
| 2017/0025589 A1 | 1/2017 | Chang et al. |
| 2017/0089547 A1 * | 3/2017 | Ollila .................. F21V 14/003 |
| 2020/0116860 A1 | 4/2020 | Lai et al. |

FOREIGN PATENT DOCUMENTS

| | | |
|---|---|---|
| KR | 10-2006-0036020 A | 4/2006 |
| KR | 10-2008-0022321 A | 3/2008 |
| KR | 10-2008-0051280 A | 6/2008 |
| KR | 10-1847468 B1 | 4/2018 |

* cited by examiner

III - III'

LIGHT SOURCE MODULE AND MOBILE DEVICE INCLUDING THE SAME

CROSS-REFERENCE TO RELATED APPLICATION

This application claims priority to Korean Patent Application No. 10-2020-0151265 filed on Nov. 12, 2020 in the Korean Intellectual Property Office, the disclosure of which is incorporated herein by reference in its entirety.

BACKGROUND

The present disclosure relates to a light source module and a mobile device including the same.

With the recent emphasis on camera functions of a mobile device such as a mobile phone, a light source module has been employed to provide flash light for capturing an image of a subject. However, a wavelength conversion unit for converting light is disposed in a light emitting device included in the optical module and is easily identified externally through a light transmission unit of the light source module due to a unique color thereof. Therefore, such an easily identified wavelength conversion unit acts as a factor impeding uniformity in the design of a mobile device.

SUMMARY

Example embodiments provide a light source module a light source module, in which a wavelength conversion unit is not identified when the light source module is not used, and a mobile device including the same.

According to an aspect of an example embodiment, there is provided a light source module including a body portion having a groove portion, a first electrode pad and a second electrode pad that are provided on a bottom surface of the groove portion, a flash light emitting diode (LED) device mounted on the bottom surface of the groove portion, a variable light transmission unit provided on the groove portion, the variable light transmission unit including a first transparent substrate and a second transparent substrate that are spaced apart from each other, an electrode portion provided on one surface of at least one of the first transparent substrate and the second transparent substrate, and a dispersion provided in a separation space between the first transparent substrate and the second transparent substrate and including charged colored particles, wherein transmissivity of light passing through the dispersion including the charged colored particles varies based on a driving voltage applied to the electrode portion, and a first side electrode and a second side electrode provided on a first side surface of the groove portion and a second side surface of the groove portion, respectively, the first side electrode electrically connecting the first electrode pad to the electrode portion of the variable light transmission unit, and the second side electrode electrically connecting the second electrode pad to the electrode portion of the variable light transmission unit.

According to another aspect of an example embodiment, there is provided a light source module including a package body having a groove portion, a semiconductor light emitting diode (LED) chip provided on a bottom surface of the groove portion, the semiconductor LED chip being configured to emit light based on a first driving voltage applied thereto, a variable light transmission unit provided on the groove portion and having light transmissivity varying based on a second driving voltage applied thereto, a first electrode side surface and a second electrode side surface provided on side surfaces of the groove portion and connecting the bottom surface of the groove portion to the variable light transmission unit, and a processor configured to control application of the first driving voltage to the semiconductor LED chip and the second driving voltage to the variable light transmission unit.

According to yet another aspect of an example embodiment, there is provided a mobile device including a housing having a first surface and a second surface opposite to the first surface, a camera module provided on at least one of the first surface of the housing and the second surface of the housing, a light source module provided on the at least one of the first surface of the housing and the second surface of the housing adjacent to the camera module, a cover portion provided on the camera module and the light source module, the cover portion having a surface on which a light blocking layer is provided, and the cover portion having a hole, in which the light blocking layer is removed, formed in each of a region corresponding to the camera module and a region corresponding to the light source module, and a processor configured to control the camera module and the light source module, wherein the light source module includes a package body having a groove portion, a semiconductor light emitting diode (LED) chip provided on a bottom surface of the groove portion, the semiconductor LED chip being configured to emit light based on a first driving voltage applied thereto, a variable light transmission unit provided on the groove portion and having light transmissivity varying based on a second driving voltage applied thereto, and a first electrode side surface and a second electrode side surface provided on side surfaces of the groove portion and connecting the bottom surface of the groove portion to the variable light transmission unit, and wherein the processor is configured to control application of the first driving voltage to the semiconductor LED chip and the second driving voltage to the variable light transmission unit.

BRIEF DESCRIPTION OF DRAWINGS

The above and/or other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
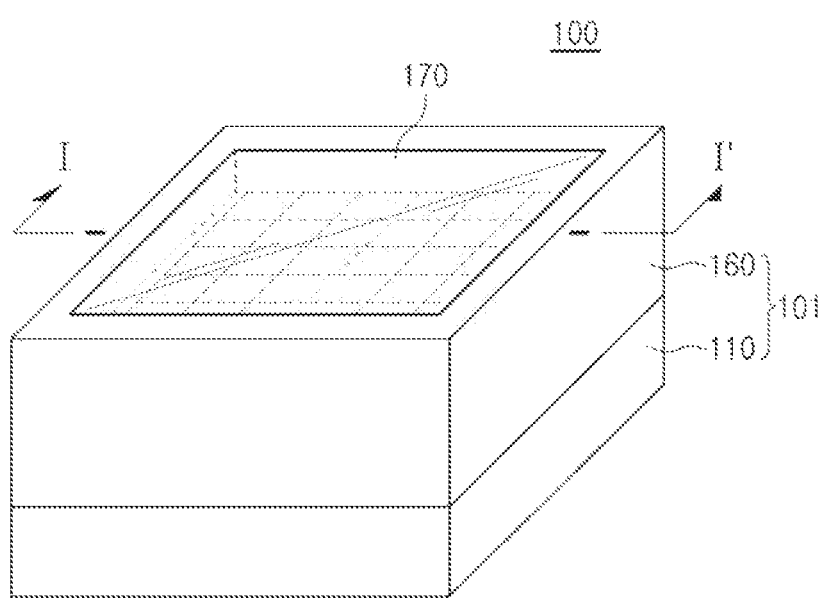
FIG. 1 is a perspective view of a light source module according to an example embodiment.
Figure 2:
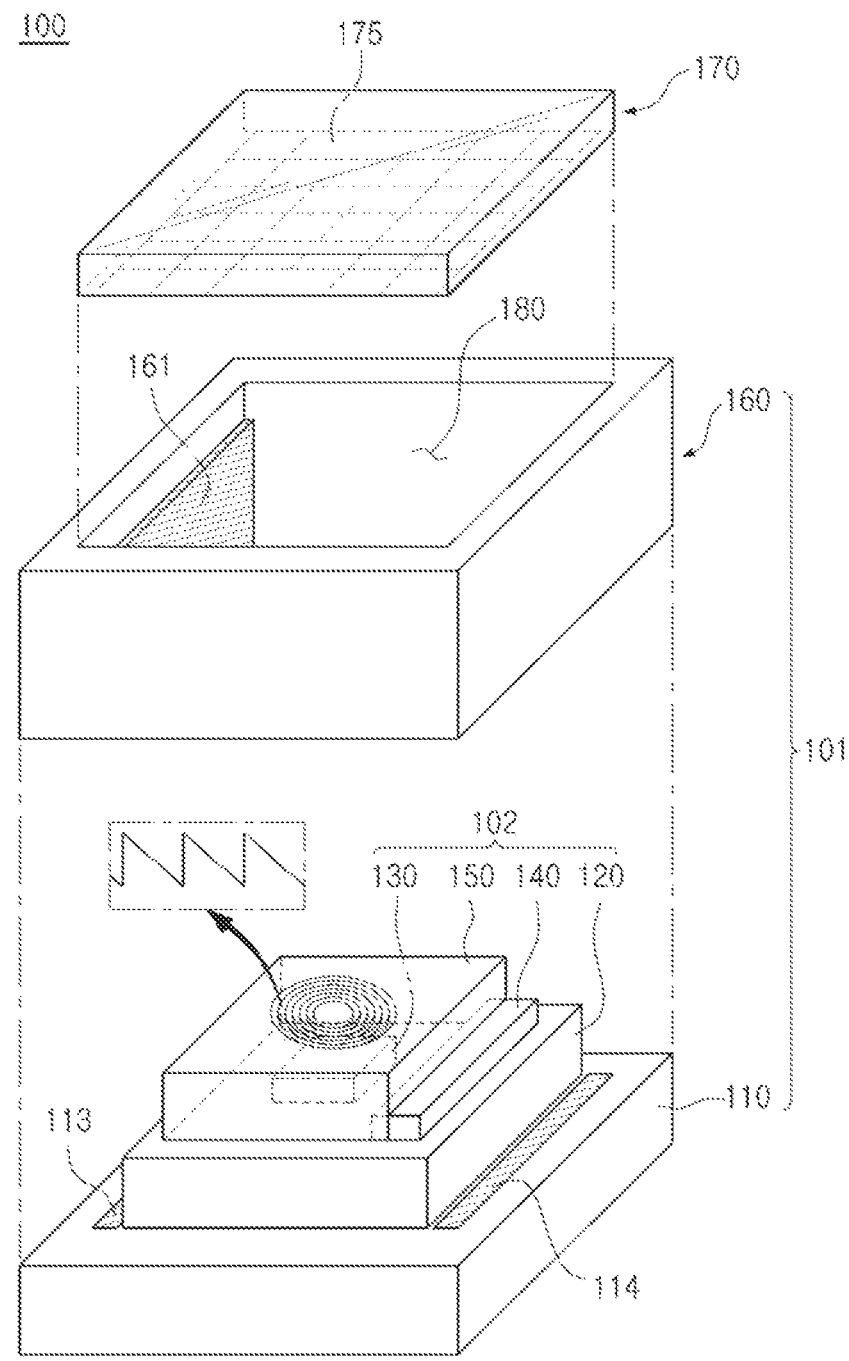
FIG. 2 is an exploded perspective view of a light source module of FIG. 1.
Figure 3:
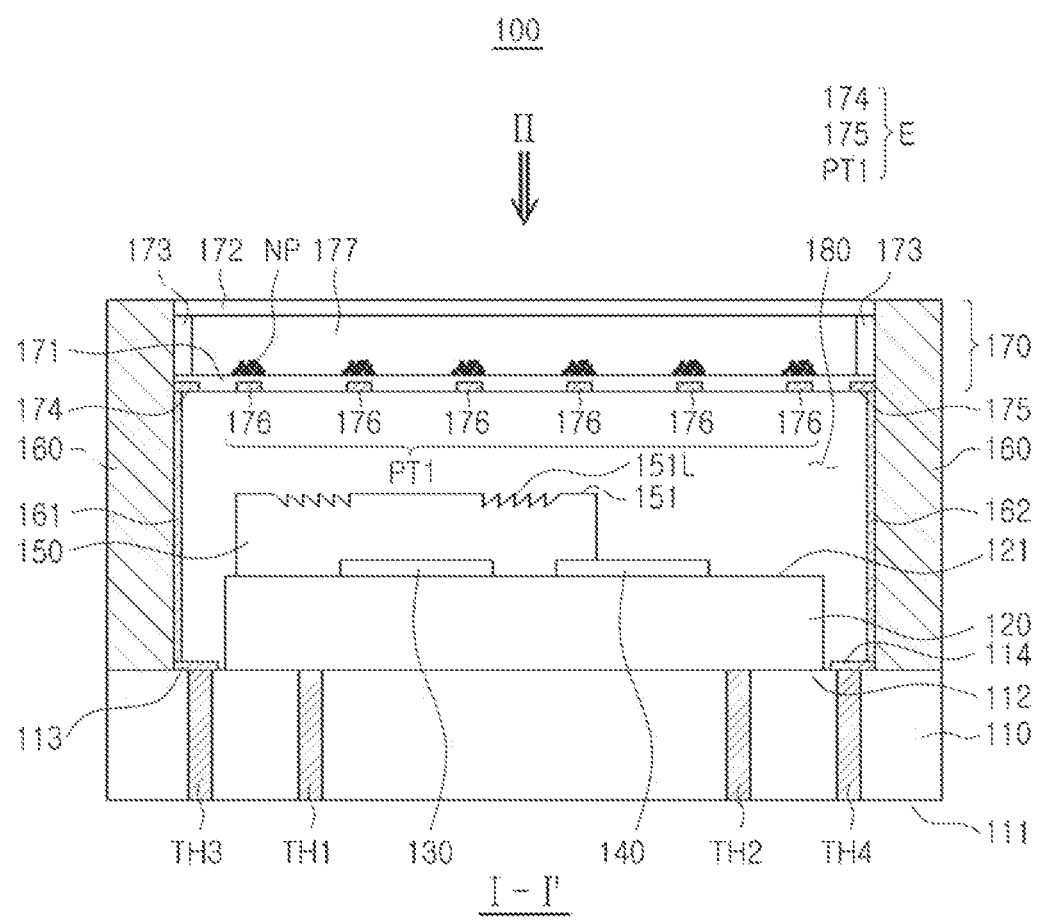
FIG. 3 is a cross-sectional view taken along line I-I' of FIG. 1.

FIG. 1 is a perspective view of a light source module according to an example embodiment, FIG. 2 is an exploded perspective view of a light source module of FIG. 1, and FIG. 3 is a cross-sectional view taken along line I-I' of FIG. 1.

Referring to FIGS. 1 and 2, a light source module 100 according to an example embodiment may include a body portion 101 having a groove portion 180, and a flash LED device 102 disposed in the groove portion 180, and a variable light transmission unit 170 covering the groove portion 180.

Referring to FIGS. 2 and 3, the body portion 101 may include a base substrate 110, disposed in a lower portion of the body portion 101 to form a bottom surface of the groove portion 180, and a sidewall structure 160 disposed above the base substrate 110 to form a sidewall of the groove portion 180. In an example embodiment, a description will be provided as to an example in which the base substrate 110 and the sidewall structure 160 are separately formed. However, embodiments are not limited thereto, and the base substrate 110 and the sidewall structure 160 may be formed to be integrated with each other according to example embodiments.

The base substrate 110 may be a substrate such as, for example, a printed circuit board (PCB), a metal core PCB (MCPCB), a metal PCB (MPCB), a flexible PCB (FPCB), a ceramic substrate, or the like. A flash light emitting diode (LED) device 102 may be electrically connected to a circuit of the base substrate 110.

Referring to FIG. 3, the base substrate 110 may have a first surface 111 and a second surface 112 disposed opposite to each other, and may include a plurality of through-electrodes TH1, TH2, TH3, and TH4 penetrating through the first surface 111 and the second surface 112. A first electrode pad 113 and a second electrode pad 114 may be disposed on the second surface 112. Among the plurality of through-electrodes TH1 to TH4, at least one pair of through-electrodes TH3 and TH4 may be electrically connected to the first electrode pad 113 and the second electrode pad 114, respectively.

The sidewall structure 160 may be disposed to be in contact with each edge provided on the periphery of an upper surface of the base substrate 110 and to form a sidewall of the groove portion 180, and may be formed of an insulating resin. A first side electrode 161 and a second side electrode 162 may be disposed on opposing internal surfaces 163 of the sidewall structure 160. The first side electrode 161 and the second side electrode 162 may be electrodes for applying power to the variable light transmission unit 170, and may electrically connect a second surface 112 of the base substrate 110 and the variable light transmission unit 170 to each other.

The flash LED device 102 may be disposed on the second surface 112 of the base substrate 110. The flash LED device 102 may include a package substrate 120, a light emitting device 130, a sensor unit 140, and a lens unit 150.

The package substrate 120 may be, for example, a substrate such as a printed circuit board (PCB), a metal core PCB (MCPCB), a metal PCB (MPCB), a flexible PCB (FPCB), a ceramic substrate, or the like. The flash LED device 102, mounted on an upper surface 121 of the package substrate 120, may be electrically connected to the plurality of through-electrodes TH1 and TH2 of the base substrate 110 through the package substrate 120.

The light emitting device 130 may be a device configured to emit white light. The light emitting device 130 may be a device in which a LED chip and a wavelength conversion unit are included to emit white light. This will be described in detail later with reference to FIG. 6.

The sensor unit 140 may be an optical sensor configured to receive surrounding light, and may be disposed adjacent to the light emitting device 130. As an example, when the light source module 100 according to an example embodiment is employed in a mobile device to be described later, when a camera of a mobile device operates the sensor unit 140, the light emitting device 130 may illuminate a flash light and the sensor unit 140 may receive surrounding light to provide information for correcting a camera image.

The lens unit 150 may be disposed to cover the light emitting device 130, and may be disposed to cover a portion of the sensor unit 140. A lens pattern 151L may be formed on an upper surface 151 of the lens unit 150 to uniformly distribute light, emitted from the light emitting device 130, at a wide angle. In example embodiments, the lens pattern 151L may constitute a Fresnel lens.

Referring to FIG. 3, the variable light transmission unit 170 may be disposed to cover the groove portion 180 of the sidewall structure 160. The variable light transmission unit 170 may include a first transparent substrate 171 and a second transparent substrate 172, an electrode portion E disposed on one surface of at least one of the first transparent substrate 171 and the second transparent substrate 172, and a dispersion 177 disposed between the first transparent substrate 171 and the second transparent substrate 172. The variable light transmission unit 170 may be provided in the form of a film. The variable light transmission unit 170 may include an electrochromic film and a polymer-dispersed liquid crystal.

Each of the first transparent substrate 171 and the second transparent substrate 172 may be a transparent film. For example, at least one of the first transparent substrate 171 and the second transparent substrate 172 may be an electrochromic film. The transparent film may be a film having improved transparency and strength. For example, the transparent film may be a transparent film of a resin including at least one selected from the group consisting of polyethylene terephthalate (PET), polyethylenenaphthalate (PEN), polyethersulfone (PES), polycarbonate (PC), poly propylene (PP), polyimide (PI), cyclo-olefin copolymer, norbomene-based resin, and combinations thereof, but embodiments are not limited thereto.

The electrode portion E may be disposed on one surface of at least one of the first transparent substrate 171 and the second transparent substrate 172. The electrode portion E may only be disposed on one of the first transparent substrate 171 and the second transparent substrate 172. However, according to example embodiment, the electrode portion E may be disposed on both of the first transparent substrate 171 and the second transparent substrate 172. The electrode portion E may be disposed on a surface, which is not in contact with the dispersion 177, of one surface of the first transparent substrate 171 and the second transparent substrate 172. However, according to example embodiments, the electrode portion E may be disposed on a surface in contact with the dispersion 177. The present example embodiment will be described as to a case in which the electrode portion E may be disposed on a surface, which is not in contact with the dispersion 177, of one surface of the first transparent substrate 171.

The electrode portion E may include a first electrode portion 174, a second electrode portion 175, and electrode patterns PT1 electrically connected by the first electrode portion 174 and the second electrode portion 175. The first electrode portion 174 and the second electrode portion 175 may be disposed to connect each of the first side electrodes 161 and the second side electrodes 162 to an edge of the variable light transmission unit 170. The electrode portion E may be formed by depositing a conductive material on the transparent film. The conductive material may include at least one selected from the group consisting of, for example, indium tin oxide (ITO), zinc oxide (ZnO), zinc tin oxide (ZTO), graphene, carbon nanotubes (CNT), fluorine-doped tin oxide (FTO), silver nanowires, a metal, a conductive polymer, and combinations thereof, but embodiments are not limited thereto.

The electrode pattern PT1 may include a microelectrode 176. The electrode pattern PT1 may be connected to the first electrode portion 174 and the second electrode portion 175, and may be supplied power through the first side electrode 161 and the second side electrode 162. The example embodiment has been described when the first electrode portion 174 and the second electrode portion 175 are disposed on both ends of the electrode pattern PT1, but embodiments are not limited thereto, and shapes and arrangements of the first electrode portion 174, the second electrode portion 175, and the electrode pattern PT1 may be modified in various manners.

Figure 8A:
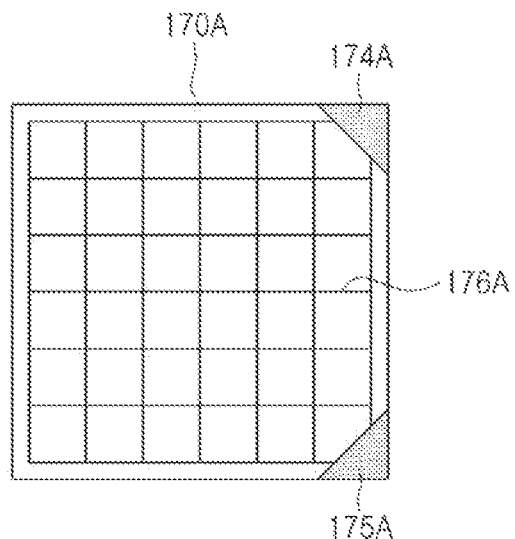
FIGS. 8A, 8B, 8C, and 8D illustrate various modified examples of a variable light transmission unit according to example embodiments.
Figure 8B:
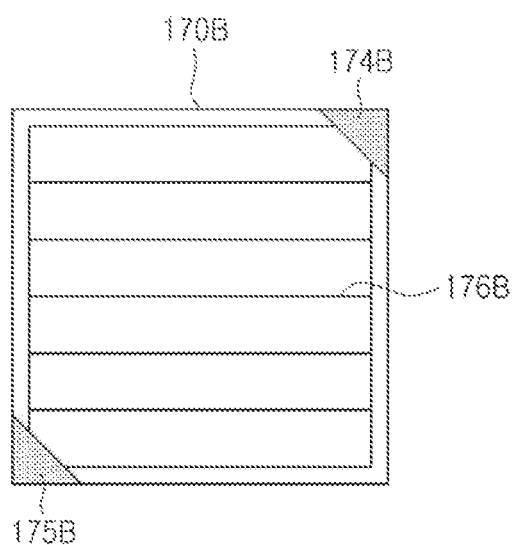
Figure 8C:
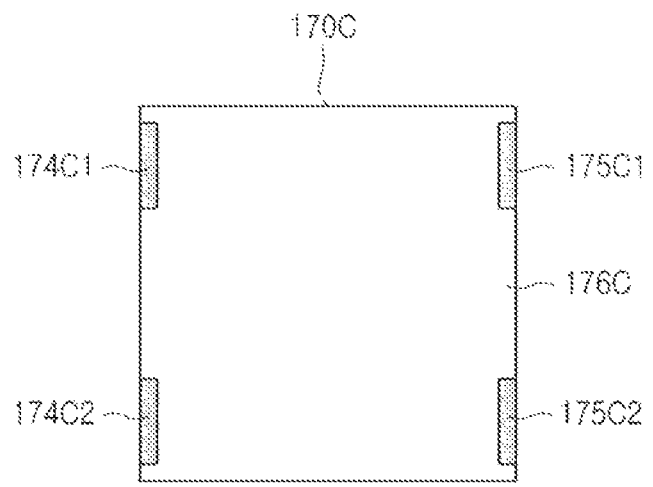
Figure 8D:
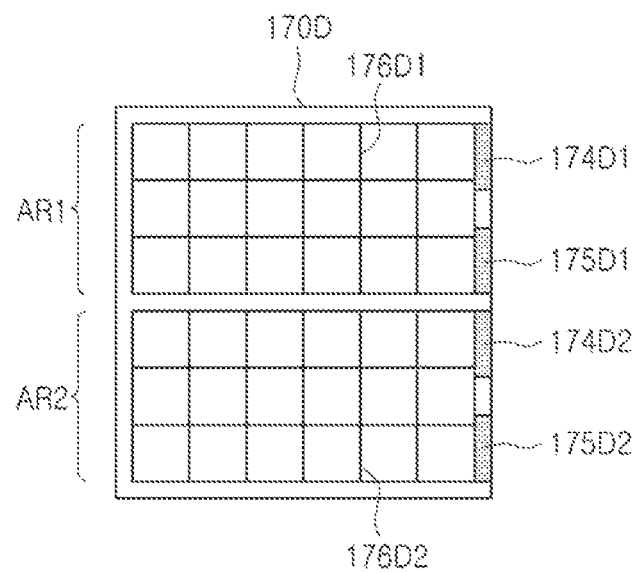

Hereinafter, various modified examples of an electrode portion will be described with reference to FIGS. 8A to 8D. Referring to FIG. 8A, a first electrode portion 174A and a second electrode portion 175A may be disposed at both vertices of one edge of a variable light transmission unit 170A, rather than on both ends of the variable light transmission unit 170A, and a microelectrode 176A may be disposed in a grid pattern to cover the entirety of the variable light transmission unit 170A. Referring to FIG. 8B, a first electrode portion 174B and a second electrode portion 175B may be respectively disposed at vertices disposed in a diagonal direction of a variable light transmission unit 170B, and a microelectrode 176B may be disposed in stripe shapes to cover the entirety of the variable light transmission unit 170B. Referring to FIG. 8C, first electrode portions 174C1 and 174C2 and second electrode portions 175C1 and 175C2 may be respectively disposed on both ends of a variable light transmission unit 170C, and a microelectrode 176C may be formed as a transparent electrode covering an entire surface of the variable light transmission unit 170C. Referring to FIG. 8D, microelectrodes may be respectively disposed in divided regions of a variable light transmission unit 170D. For example, a first microelectrode 176D1 and a second microelectrode 176D2 may be disposed in a first region AR1 and a second region AR2 to be electrically separated from each other. A first electrode portion 174D1 and a second electrode portion 175D1 may be connected to the first microelectrode 176D1, and a first electrode portion 174D2 and a second electrode portion 175D2 may be connected to the second microelectrode 176D2.

Referring to FIG. 3, the dispersion 177 including charged colored particles NP may be disposed between the first transparent substrate 171 and the second transparent substrate 172. The dispersion 177 may be encapsulated by an encapsulant 173 disposed on edges of the first transparent substrate 171 and the second transparent substrate 172.

The dispersion 177 may be an insulating transparent medium, but is not limited thereto. For example, the dispersion 177 may include liquid crystal. Each of the charged colored particles NP, dispersed in the dispersion 177, may have a micro-unit size. The charged colored particles NP may exist in a state of being chaotically dispersed in the dispersion 177 when a voltage is not applied to the dispersion 177. In this case, the charged colored particles NP may be uniformly dispersed in the dispersion 177 to block transmission of light incident to the dispersion 177.

The charged colored particles NP may be charged particles having colors on surfaces thereof, and the colors of the surfaces may include various chromatic or achromatic colors. For example, the charged colored particles NP may have a black color. As described later, when the light source module 100 according to an example embodiment is applied to a mobile device, the charged colored particles NP may have the same color as a light blocking layer applied to the transparent substrate covering the light source module 100.

The charged colored particles NP may include, for example, at least one selected from the group consisting of metal particles, polymer particles, inorganic particles, semiconductor particles, and combinations thereof. For example, the charged colored particles NP may include metal particles including elements such as aluminum, copper, silver, silicon, carbon, iron, nickel, gold, titanium, zinc, zirconium, tungsten, and combinations thereof, polymer particles such as polystyrene, polypropylene, polyvinyl chloride, polyethylene, and polypropylene, and inorganic particles such as carbon black, but embodiments are not limited thereto.

Figure 4A:
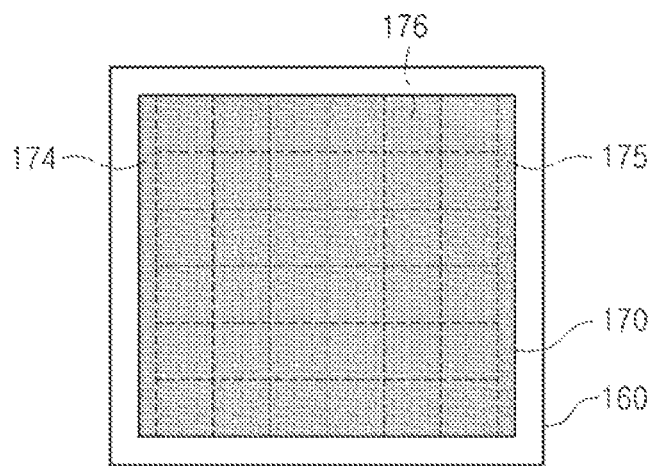
FIGS. 4A and 4B are views illustrating a state in which power supply to a variable light transmission unit is cut off.
Figure 4B:
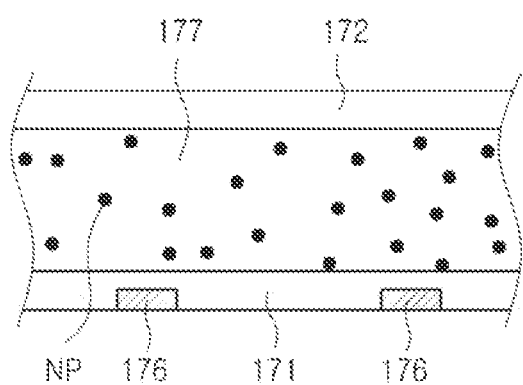
Figure 5A:
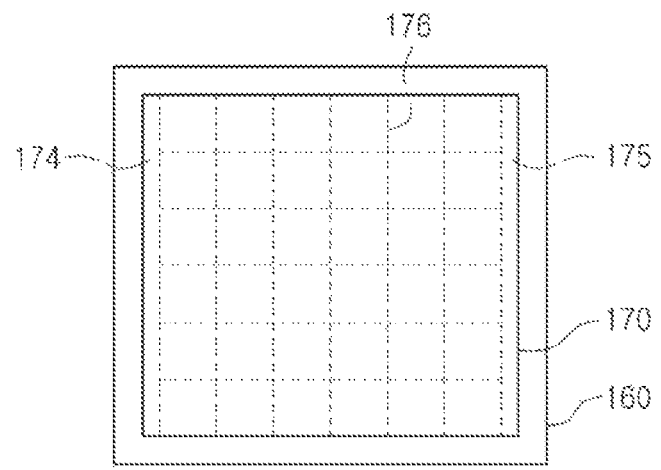
FIGS. 5A and 5B are views illustrating a state in which power is applied to a variable light transmission unit.
Figure 5B:
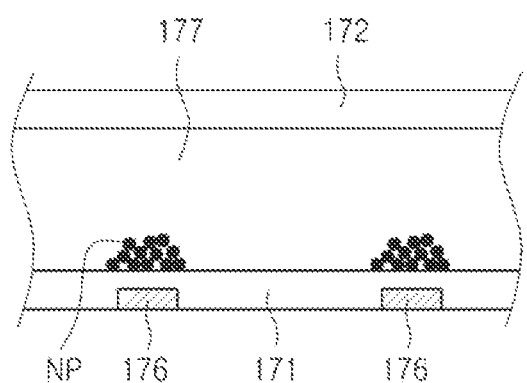

Hereinafter, the operation of the variable light transmission unit 170 will be described with reference to FIGS. 4A to 5B. FIG. 4A illustrates a state in which a driving voltage is not applied to the variable light transmission unit 170, and illustrates that light transmissivity is reduced to be dark. FIG. 4B illustrates a state in which charged colored particles NP are chaotically dispersed in a dispersion 177 when the driving voltage is not applied to the variable light transmission unit 170. FIG. 5A illustrates a state in which a driving voltage is applied to a variable light transmission unit 170, so that light transmissivity of the variable light transmission unit 170 is increased to be transparent. FIG. 5B illustrates a state in which charged colored particles NP are gathered on a microelectrode 176 when the driving voltage is applied to the variable light transmission unit 170.

Referring to FIGS. 4A and 4B, when a voltage is not applied, charged colored particles NP exist in the state of being uniformly dispersed in the dispersion 177. Since transmission of light is blocked, light transmissivity of the variable light transmission unit 170 may be, for example, 0% to about 10%. In this case, the variable light transmission unit 170 may be shown to be almost opaque.

Referring to FIGS. 5A and 5B, when a voltage is applied to the variable light transmission unit 170, an electric field may be generated in the microelectrode 176 to charge the microelectrode 176. The colored particles NP may be charged with a polarity opposite to a polarity of the microelectrode 176 when the voltage is applied. Therefore, when the voltage is applied, an electrical attractive force may act between the charged colored particles NP and the microelectrode 176.

As the charged colored particles NP are electrophoresed by the electrical attractive force, generated when the voltage is applied to the variable light transmission unit 170, to be gathered on the microelectrode 176, the charged colored particles NP may be arranged to correspond to an electrode pattern PT1.

As described above, as the charged colored particles NP are concentrated on the microelectrode 176, an area occupied by the charged colored particles NP in a cross-section, perpendicular to a direction in which light is incident to the variable light transmission unit 170, may be gradually decreased and an area, in which the charged colored particles NP are not present, may be gradually increased. Accordingly, since light is not blocked by the charged colored particles NP in the cross-section, perpendicular to the direction in which the light of the variable light transmission unit 170 is incident, a light-transmitting area may be gradually increased, so that the light transmissivity of the variable light transmission unit 170 may be gradually increased.

Figure 6:
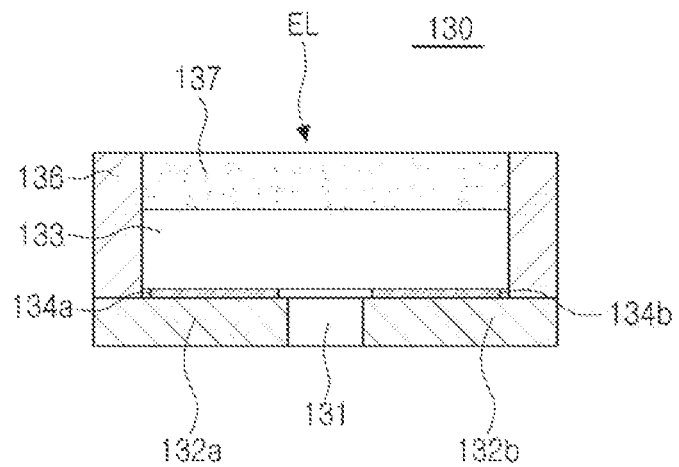
FIG. 6 is a cross-sectional view of a flash LED device employable in a light source module according to an example embodiment.

FIG. 6 is a cross-sectional view of a flash LED device employable in a light source module according to an example embodiment.

Referring to FIG. 6, a light emitting device 130 according to an example embodiment may include a wiring substrate 131 having first wiring electrode 132a and a second wiring electrode 132b, a light emitting diode chip 133 mounted on the wiring substrate 131 and having a first surface on which a first electrode 134a and a second electrode 134b, respectively connected to a first wiring electrode 132a and a second wiring electrode 132b, are disposed, a second surface disposed to oppose the first surface, and a side surface disposed between the first surface and the second surface, and a wavelength conversion film 137 disposed on the second surface of the light emitting diode chip 133.

The light emitting device 130 may further include a reflective structure 136 surrounding the side surface of the light emitting diode chip 133 and the wavelength conversion film 137, as described above. In the light emitting device 130 illustrated in FIG. 6, the reflective structure 136 may prevent light, emitted from the light emitting device 130, from affecting an adjacent sensor unit 140. In an example embodiment, the light emitting region EL may be provided by the wavelength conversion film 137 and may be defined by the reflective structure 136.

The wiring substrate 131 may include either one of an insulating resin and a ceramic substrate. The first and second wiring electrodes 132a and 132b may include metals such as gold (Au), copper (Cu), silver (Ag), and aluminum (Al). The first electrode 134a and the second electrode 134b of the light emitting diode chip 133 may be connected to the first wiring electrode 132a and the second wiring electrode 132b by solder balls, respectively. The wavelength conversion film 137 may include at least one type of wavelength conversion material converting a portion of the light, emitted from the light emitting diode chip 133, into light having a first wavelength different from a light emitting wavelength. The wavelength conversion film 137 may be a resin layer or a ceramic phosphor film in which wavelength conversion materials are dispersed. For example, the wavelength conversion material may be at least one of a phosphor and a quantum dot.

For example, the light emitting device 130 may be configured to emit white light. In example embodiments, the light emitting diode chip 133 may emit blue light. For example, the light emitting diode chip 133 may emit light having a dominant wavelength ranging from 440 nm to 460 nm. The wavelength conversion material of the wavelength conversion film 137 may include a phosphor or a quantum dot converting a portion of blue light, emitted from the light emitting diode chip 133, into yellow light. However, embodiments are not limited thereto. For example, the wavelength conversion material of the wavelength conversion film 137 may include a plurality of phosphors or quantum dots converting a portion of blue light, emitted from the light emitting diode chip 133, into red light and green light.

Figure 7:
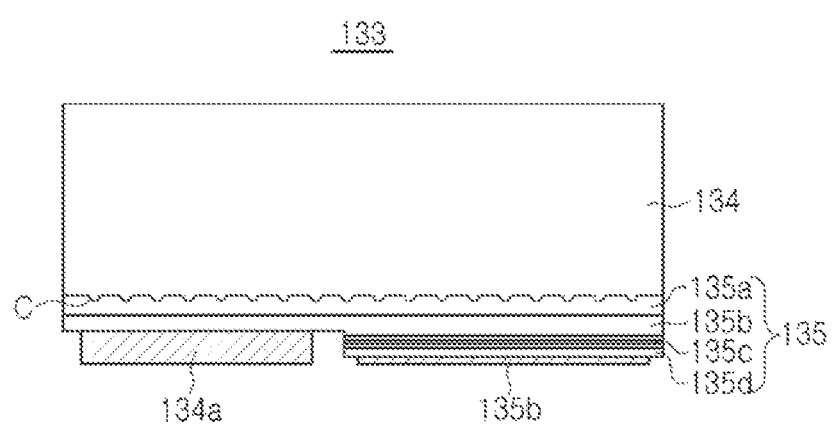
FIG. 7 is a cross-sectional view of an LED chip employable in a flash LED device.

The light emitting device 130 according to an example embodiment may employ various types of light emitting diode chip, and may mainly have a flip-chip structure. FIG. 7 is a cross-sectional view illustrating a light emitting diode chip 133 employable in the light emitting device 130.

Referring to FIG. 7, the light emitting diode chip 133 may include a substrate 134 and a semiconductor stack 135 including a first-conductivity-type semiconductor layer 135b, an active layer 135c, and a second-conductivity-type semiconductor layer 135d sequentially disposed on the substrate 134. A buffer layer 135a may be disposed between the substrate 134 and the first-conductivity-type semiconductor layer 135b.

The substrate 134 may be an insulating substrate such as sapphire. However, embodiments are not limited thereto, and the substrate 134 may be a conductive substrate or a semiconductor substrate, other than the insulating substrate. For example, the substrate 134 may be silicon carbide (SiC), silicon (Si), magnesium aluminum oxide ($MgAl_2O_4$), magnesium oxide (MgO), lithium aluminate ($LiAlO_2$), $LiGaO_2$, or gallium nitride (GaN), other than sapphire. An unevenness C may be formed on an upper surface of the substrate 134. The unevenness C may improve the quality of a grown single crystal while improving light extraction efficiency.

The buffer layer 135a may be $In_xAl_yGa_{1-x-y}N$ ($0 \leq x \leq 1$, $0 \leq y \leq 1$). For example, the buffer layer 135a may be GaN, aluminum nitride (AlN), aluminum gallium nitride (AlGaN), or indium gallium nitride (InGaN). A plurality of layers may be combined, or some compositions may be gradually changed and then used.

The first-conductivity-type semiconductor layer 135b may be a nitride semiconductor layer satisfying N-type $In_xAl_yGa_{1-x-y}N$ ($0 \leq x < 1$, $0 \leq x+y < 1$), and an N-type impurity may be silicon (Si). For example, the first-conductivity-type semiconductor layer 135b may include an N-type gallium nitride (GaN). The second-conductivity-type semiconductor layer 135d may be a nitride semiconductor layer satisfying P-type $In_xAl_yGa_{1-x-y}N$ ($0 \leq x < 1$, $0 \leq y < 1$, $0 \leq x+y < 1$), and a P-type impurities may be magnesium (Mg). For example, the second-conductivity-type semiconductor layer 135d may be implemented to have a single-layer structure, but embodiments are not limited thereto. For example, the second-conductivity-type semiconductor layer 135d may have a multilayer structure having different compositions.

The active layer 135c may have a multi-quantum-well (MQW) structure in which a quantum-well layer and a quantum barrier layer are alternately stacked. For example, the quantum-well layer and the quantum barrier layer may be $In_xAl_yGa_{1-x-y}N$ ($0 \leq x \leq 1$, $0 \leq y \leq 1$, $0 \leq x+y \leq 1$) having different compositions. In a specific example, the quantum-well layer may be $In_xGa_{1-x}N$ ($0 < x \leq 1$), and the quantum barrier layer may be GaN or AlGaN. Each of the quantum-well layer and the quantum barrier layer may have a thickness ranging from 1 nm to 50 nm. The active layer 135c is not limited to a multi-quantum-well structure, but embodiments are not limited thereto. For example, the active layer 135c may be a single-quantum-well (SQW) structure.

The first electrode 134a and the second electrode 134b may be respectively disposed in a mesa-etched region of the first-conductivity-type semiconductor layer 135b and the second-conductivity-type semiconductor layer 135d to be provided on the same surface of the light emitting diode chip 133. As a non-limiting example, the first electrode 134a may include a material such as Ag, nickel (Ni), aluminum (Al), chromium (Cr), rhodium (Rh), palladium (Pd), iridium (Ir), ruthenium (Ru), magnesium (Mg), zinc (Zn), platinum (Pt), gold (Au), or the like. The first electrode 134a may be employed to have a single-layer structure or a multilayer structure. As necessary, the second electrode 134b may be a transparent electrode such as a transparent conductive oxide or a transparent conductive nitride, or may include graphene. The second electrode 134b may include at least one of Al, Au, Cr, Ni, titanium (Ti), and tin (Sn).

Figure 9:
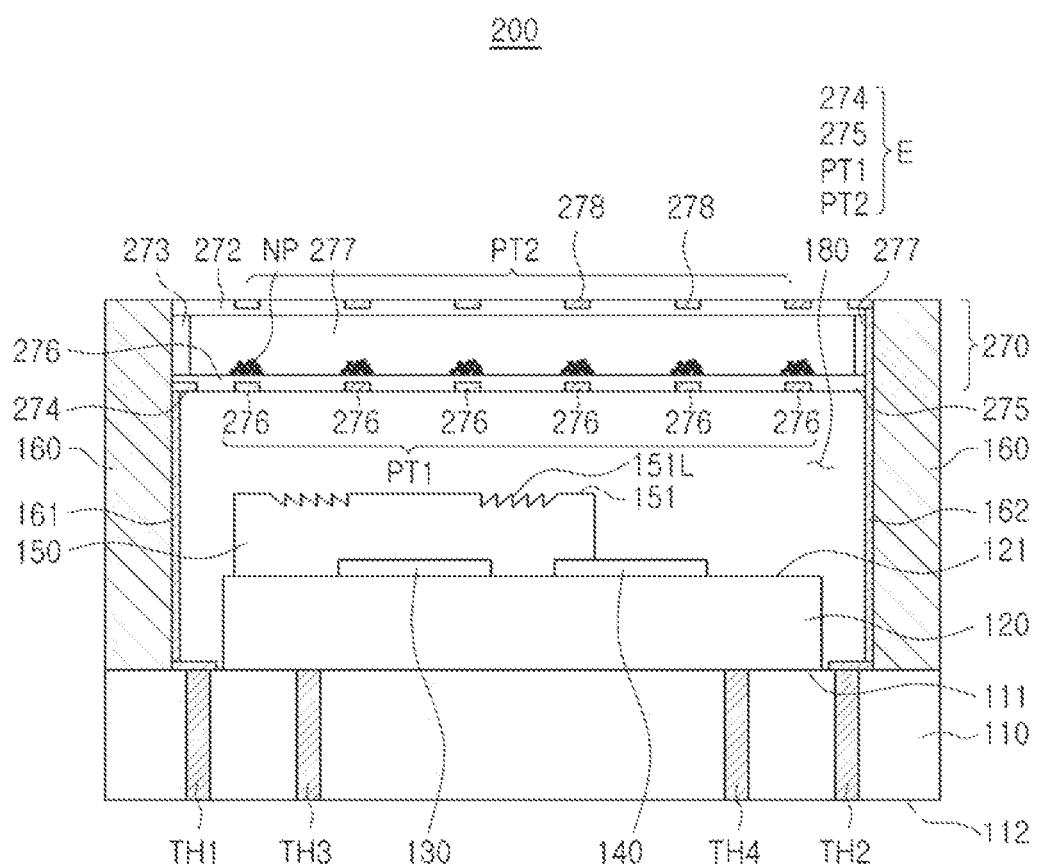
FIG. 9 is a cross-sectional view of a light source module according to an example embodiment.

Hereinafter, a light source module 200 according to an example embodiment will be described with reference to FIGS. 9 to 10B. FIG. 9 is a cross-sectional view of a light source module according to an example embodiment, and FIGS. 10A and 10B are views illustrating various modified examples of an additional electrode unit of FIG. 9.

According to an example embodiment, the light source module 200 illustrated in FIG. 9 may include an electrode portion E, including a first electrode pattern PT1 and a second electrode pattern PT2, and a first electrode portion 274 and a second electrode portion 275, respectively disposed on a first transparent substrate 271 and a second transparent substrate 272. Since the other elements of the light source module 200 are the same as those of the above-described light source module 100, descriptions of the same elements designated by the same reference numerals will be omitted.

Referring to FIG. 9, a variable light transmission unit 270 of the light source module 200 according to an example embodiment may include the first transparent substrate 276 and a second transparent substrate 272, and the first electrode portion 274 and a second electrode portion 275 may be disposed on one surface of the first transparent substrate 276 and one surface of the second transparent substrate 272, respectively. In this case, the first electrode portion 274 and the second electrode portion 275 may have the same shape and may be disposed to overlap each other when viewed from above. Accordingly, a driving voltage applied from the first side electrode 161 and the second side electrode 162 may be applied to each of the first electrode pattern PT1 and the second electrode pattern PT2 through the first electrode portion 174 and the second electrode portion 175 to generate an electric field in a thickness direction of the variable light transmission unit 270.

Figure 10A:
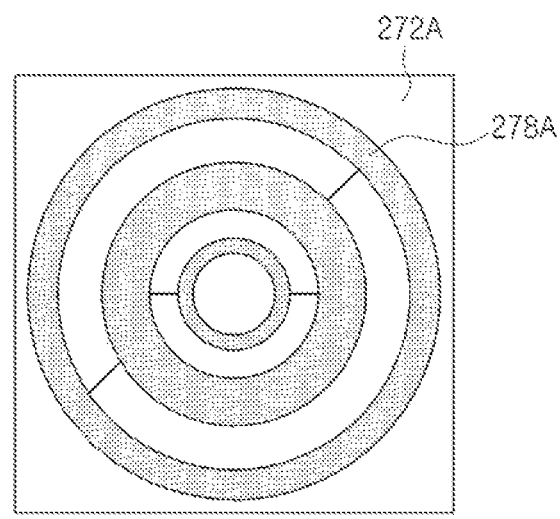
FIGS. 10A and 10B are views illustrating various modified examples of an additional electrode unit of FIG. 9 according to example embodiments.
Figure 10B:
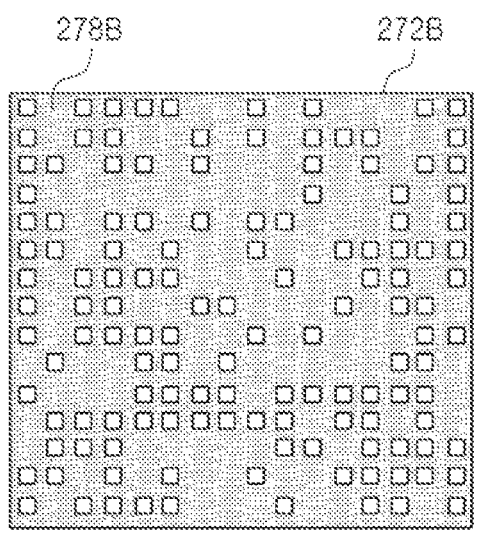

FIGS. 10A and 10B are examples of a microelectrode 278 of the second electrode pattern PT2 disposed on the second transparent substrate 272. FIG. 10A illustrates an example in which a microelectrode 278A is formed on the second transparent substrate 272A to have a type of zone plate shape, and the same effect as a type of lens may be provided to light passing through a variable light transmission unit 270. FIG. 10B illustrates an example in which a microelectrode 278B is formed on the second transparent substrate 272B to have an irregular pattern, and light passing through a variable light transmission unit 270 may irradiate irregularly arranged dots on an irradiation surface.

Figure 11:
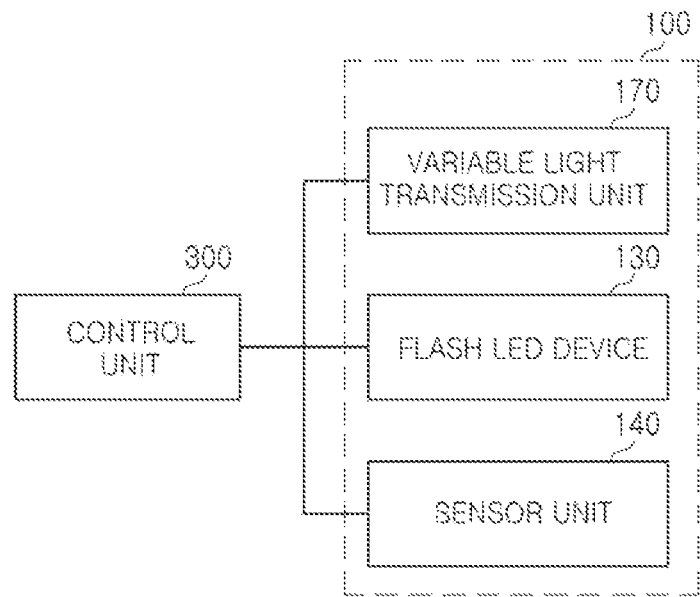
FIG. 11 is a block diagram of a light source module according to an example embodiment.

Referring to FIG. 11, the above-configured light source module 100 may be controlled by a control unit 300. For example, a flash LED device 102, a sensor unit 140, and a variable light transmission unit 170, included in the light source module 100, may be controlled by the control unit 300 to control whether to apply or cut off driving power. In the light source module 100 according to an example embodiment, when driving power is not applied to the variable light transmission unit 170, the inside of the light source module 100 may not project through the variable light transmission unit 170. Therefore, the flash LED device 102 disposed below the variable light transmission unit 170 may be invisible from the outside of the light source module 100. The control unit 300 may include an application specific integrated circuit (ASIC), a field-programmable gate array (FPGA), a dedicated microprocessor, a microprocessor, a general purpose processor, or the like.

When driving power is applied to the variable light transmission unit 170, the inside of the light source module 100 may project through the variable light transmission unit 170. Therefore, light of the flash LED device 102 may pass through the variable light transmission unit 170. To this end, the control unit 300 may apply driving power to the variable light transmission unit 170 to make the variable light transmission unit 170 transparent before applying the driving power to the flash LED device 102 to emit light.

Figure 12:
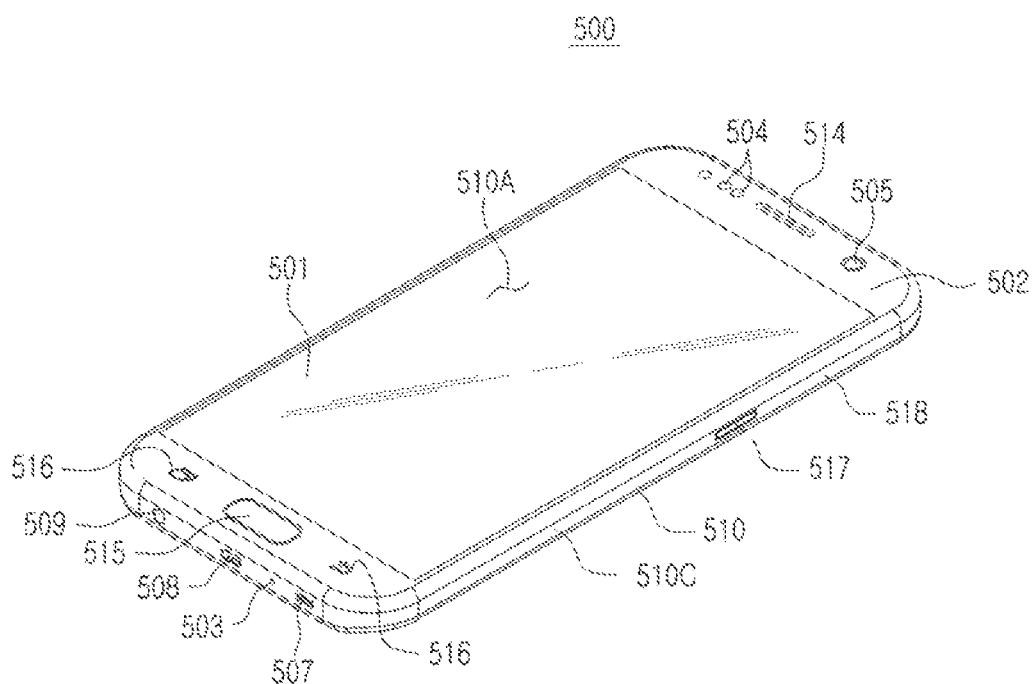
FIGS. 12 and 13 are perspective views illustrating a front surface and a rear surface of a mobile device with a built-in camera according to an example embodiment, respectively.
Figure 13:
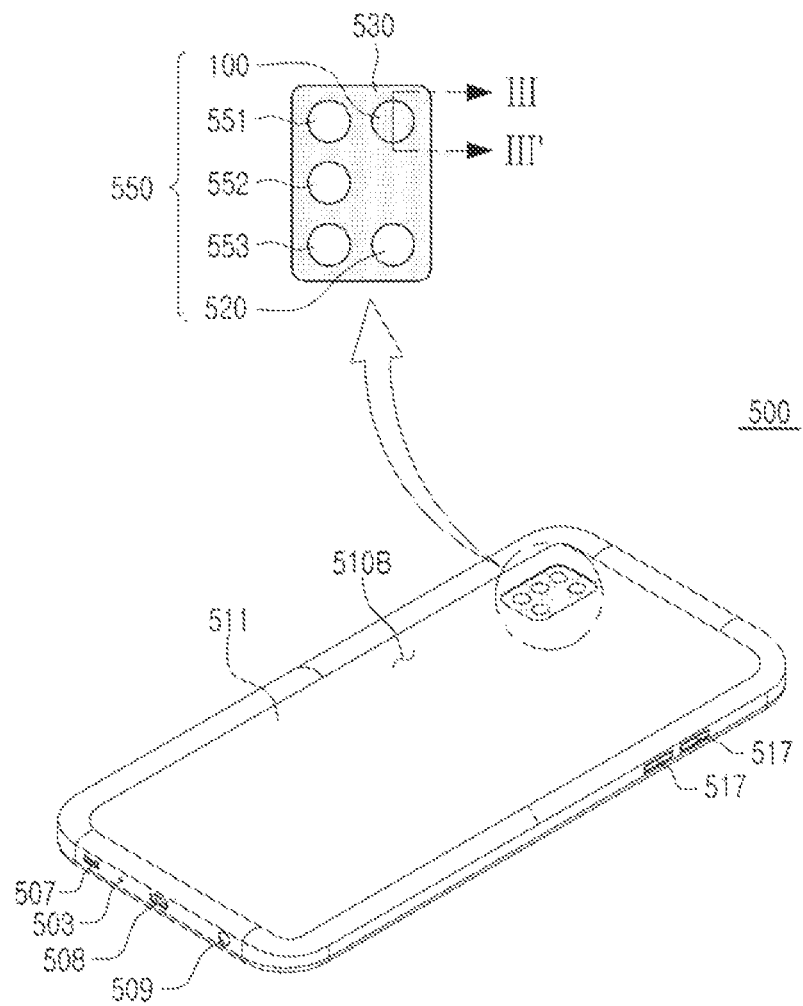
Figure 14:
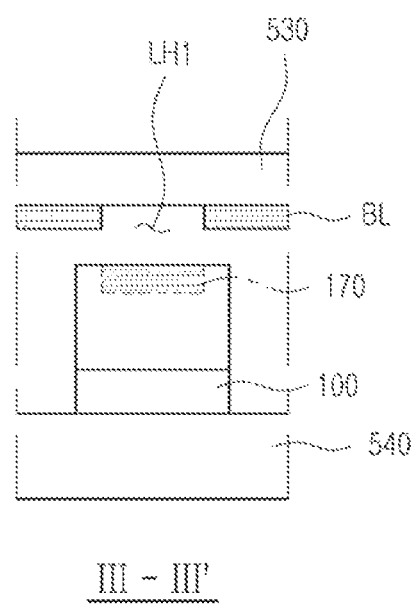
FIG. 14 is a cross-sectional view taken along line of FIG. 13.

Hereinafter, a mobile device employing the above-described light source module according to an example embodiment will be described. FIGS. 12 and 13 are perspective views illustrating a front surface and a rear surface of a mobile device with a built-in camera according to an example embodiment, respectively. FIG. 14 is a cross-sectional view taken along line of FIG. 13.

Referring to FIGS. 12 and 13, a mobile device 500 according to an example embodiment may include a housing 510 having a first surface (or a front surface) 510A, a second surface (or a rear surface) 510B, and a side surface 510C surrounding a space between the first surface 510A and the second surface 510B.

In an example embodiment, the first surface 510A may be formed by a front plate 502 having at least a substantially transparent portion, for example, a glass or polymer including various coating layers. The second surface 510B may be formed by a substantially opaque rear plate 511. The rear plate 511 may be formed of, for example, a coated or colored glass, a ceramic, a polymer, a metal, or a combination of at least two materials, among the above materials. The side surface 510C may be coupled to the front plate 502 and the rear plate 511, and may be formed by a side bezel structure (or "a side member") 518 including a metal and/or a polymer.

The mobile device 500 according to an example embodiment may include at least one of a display 501, audio modules 503, 507, and 514, a sensor module 504, a plurality of camera modules 505 and 550, key input devices 515, 516, and 517, an indicator 506, and connector holes 508 and 509. In example embodiments, the mobile device 500 may exclude at least one of the above-mentioned elements or may further include another element.

The display 501 may be exposed through a portion corresponding to the front plate 502, for example. The display 501 may be coupled to or disposed adjacent to a touch sensing circuit, a pressure sensor capable of measuring the intensity (pressure) of a touch, and/or a digitizer detecting a magnetic-type stylus pen.

The audio module 503, 507, and 514 may include a microphone hole 503 and speaker holes 507 and 514. A microphone for obtaining external sound may be disposed within the microphone hole 503. In example embodiments, a plurality of microphones may be disposed to detect a direction of sound. The speaker holes 507 and 514 may include an external speaker hole 507 and a receiver hole 514 for a call. The speaker hole 507 and 514 and the microphone hole 503 may be implemented with a single hole, or a speaker may be included without the speaker holes 507 and 514.

The camera modules 505 and 550 may be disposed on the first surface 510A and the second surface 510B of the mobile device 500, respectively. The camera modules 505 and 550 may include one or more lenses, an image sensor, and/or an image signal processor. The camera module 550, disposed on the second surface 510B, may include a plurality of RGB cameras 551, 552, and 553, a light source module 100, and a TOF camera 520. The plurality of RGB cameras 551, 552, and 553 may include a super wide-angle lens camera 551, a wide-angle lens camera 552, and a narrow-angle lens camera 553. The light source module 100 may provide white light for the plurality of RGB cameras 551, 552, 553 and irregular pattern light for the TOF camera 520 in a single package. Referring to FIGS. 12 and 13, a transparent substrate 530 such as a glass for protecting the camera module 550 and the light source module 100 may be disposed on the front surface of the light source module 100. A light blocking layer BL may be disposed on one surface of the transparent substrate 530, and a hole LH1 for light transmission may be disposed in a region corresponding to the light source module 100. As described above, a variable light transmission unit 170 of the light source module 100 may not be applied with driving power and may be in an opaque state. In this case, the variable light transmission unit 170 may have the same color as the light blocking layer BL. In this case, when the light source module 100 is not used, the light blocking layer BL and the variable light transmission unit 170 of the light source module 100 have the same color, so that the light blocking layer BL and the variable light transmission unit 170 are shown to be integrated with each other when viewed from the outside.

The sensor module 504 may generate an electrical signal or a data value corresponding to an internal operating state of the mobile device 500 or an external environmental state. The sensor module 504 may be, for example, a proximity sensor.

The key input devices 515, 516, and 517 may include a home key button 515 disposed on the first surface 510A of the housing 510, a touch pad 516 disposed around the home key button 515, and/or a side key button 517 disposed on the side surface 510C of the housing 510. In example embodiments, the mobile device 500 may not include some or all of the above-described components, and another input means may be implemented on the display 501 in the form of a soft key.

The indicator 506 may be disposed, for example, on the first surface 510A of the housing 510. The indicator 506 may provide, for example, status information of the mobile device 500 in the form of light, and may include an LED. The connector holes 508 and 509 may include a first connector hole 508 capable of accommodating a connector, for example, a USB connector, for transmitting or receiving power and/or data to or from an external electronic device, and/or a second connector hole 509, for example, an earphone jack, capable of accommodating a connector for transmitting and receiving an audio signal to or from the external electric device.

A sensor-integrated flash LED package according to an example embodiment may be advantageously applied to various electronic devices including a camera or an image sensor, other than mobile communications terminals similar to the example embodiment.

As described above, when a light source module according to an example embodiment is not used, light transmissivity of a light transmission unit may be reduced, so that a wavelength conversion unit may not be identified.

In addition, when a mobile device according to an example embodiment is not used, light transmissivity of a light transmission unit may be reduced, so that a wavelength conversion unit may not be identified.

While example embodiments have been shown and described above, it will be apparent to those skilled in the art that modifications and variations could be made without departing from the scope of the present disclosure as defined by the appended claims.

What is claimed is:

1. A light source module comprising:
a body portion having a groove portion;
a first electrode pad and a second electrode pad that are provided on a bottom surface of the groove portion;
a flash light emitting diode (LED) device mounted on the bottom surface of the groove portion;
a variable light transmission unit provided on the groove portion, the variable light transmission unit comprising:
a first transparent substrate and a second transparent substrate that are spaced apart from each other;
an electrode portion provided on one surface of at least one of the first transparent substrate and the second transparent substrate; and
a dispersion provided in a separation space between the first transparent substrate and the second transparent substrate and including charged colored particles, wherein transmissivity of light passing through the dispersion including the charged colored particles varies based on a driving voltage applied to the electrode portion; and
a first side electrode and a second side electrode provided on a first side surface of the groove portion and a second side surface of the groove portion, respectively, the first side electrode electrically connecting the first electrode pad to the electrode portion of the variable light transmission unit, and the second side electrode electrically connecting the second electrode pad to the electrode portion of the variable light transmission unit.

2. The light source module of claim 1, wherein the body portion further comprises:
a base substrate on which the first electrode pad and the second electrode pad are provided; and
a sidewall structure contacting a periphery portion of the base substrate and forming a sidewall of the groove portion.

3. The light source module of claim 1, wherein the electrode portion is provided on one of a surface of the first transparent substrate and a surface of the second transparent substrate, and
wherein the first side electrode and the second side electrode are connected to the electrode portion.

4. The light source module of claim 1, wherein the electrode portion comprises:
a first electrode portion provided on the first transparent substrate and connected to the first side electrode; and
a second electrode portion provided on the second transparent substrate and connected to the second side electrode.

5. The light source module of claim 4, wherein a pattern of the first electrode portion and a pattern of the second electrode portion are the same, and
wherein the first electrode portion and the second electrode portion overlap each other.

6. The light source module of claim 1, wherein the electrode portion is charged with a first polarity based on the driving voltage being applied, and the charged colored particles are charged with a second polarity opposite to the first polarity.

7. The light source module of claim 1, wherein the electrode portion has a linear pattern or a plane pattern formed on an entirety of one of the surface of the first transparent substrate and the surface of the second transparent substrate.

8. The light source module of claim 1, wherein the electrode portion includes at least one of indium tin oxide (ITO), zinc oxide (ZnO), zinc tin oxide (ZTO), graphene, carbon nanotubes (CNT), fluorine-doped tin oxide (FTO), silver nanowires, a metal, a conductive polymer, and combinations thereof.

9. The light source module of claim 1, wherein the flash LED device comprises:
a package substrate provided on the bottom surface of the groove portion;
a light emitting diode (LED) chip provided on the package substrate;
a sensor provided on the package substrate and spaced apart from the LED chip; and
a lens provided on the LED chip.

10. The light source module of claim 9, wherein a Fresnel lens is provided on a region of an upper surface of the lens overlapping the LED chip.

11. The light source module of claim 1, wherein the variable light transmission unit is formed of at least one of an electrochromic film and a polymer-dispersed liquid crystal.

12. A light source module comprising:
a package body having a groove portion;
a semiconductor light emitting diode (LED) chip provided on a bottom surface of the groove portion, the semiconductor LED chip being configured to emit light based on a first driving voltage applied thereto;
a variable light transmission unit provided on the groove portion and having light transmissivity varying based on a second driving voltage applied thereto;
a first electrode side surface and a second electrode side surface provided on side surfaces of the groove portion and connecting the bottom surface of the groove portion to the variable light transmission unit; and
a processor configured to control application of the first driving voltage the semiconductor LED chip and the second driving voltage to the variable light transmission unit.

13. The light source module of claim 12, wherein the variable light transmission unit is formed of at least one of an electrochromic film and a polymer-dispersed liquid crystal, and the light transmissivity of the variable light transmission unit is increased when the second driving voltage is applied thereto.

14. The light source module of claim 12, wherein the processor is further configured to apply the first driving voltage to the semiconductor LED chip after applying the second driving voltage to the variable light transmission unit.

15. A mobile device comprising:
a housing having a first surface and a second surface opposite to the first surface;
a camera module provided on at least one of the first surface of the housing and the second surface of the housing;
a light source module provided on the at least one of the first surface of the housing and the second surface of the housing adjacent to the camera module;
a cover portion provided on the camera module and the light source module, the cover portion having a surface on which a light blocking layer is provided, and the cover portion having a hole, in which the light blocking layer is removed, formed in each of a region corresponding to the camera module and a region corresponding to the light source module; and
a processor configured to control the camera module and the light source module,
wherein the light source module comprises:
a package body having a groove portion;
a semiconductor light emitting diode (LED) chip provided on a bottom surface of the groove portion, the semiconductor LED chip being configured to emit light based on a first driving voltage applied thereto;
a variable light transmission unit provided on the groove portion and having light transmissivity varying based on a second driving voltage applied thereto; and
a first electrode side surface and a second electrode side surface provided on side surfaces of the groove portion and connecting the bottom surface of the groove portion to the variable light transmission unit, and
wherein the processor is configured to control application of the first driving voltage to the semiconductor LED chip and the second driving voltage to the variable light transmission unit.

16. The mobile device of claim 15, wherein the variable light transmission unit comprises:
a first transparent substrate and a second transparent substrate provided on the groove portion and spaced apart from each other;
an electrode portion provided on at least one of a surface of the first transparent substrate and a surface of the second transparent substrate; and
a dispersion provided in a separation space between the first transparent substrate and the second transparent substrate and including charged colored particles, and
wherein transmissivity of light passing through the dispersion including the charged colored particles varies based on a driving voltage applied to the electrode portion.

17. The mobile device of claim 16, wherein, when the second driving voltage is applied to the variable light transmission unit, the electrode portion is charged with a first polarity and the charged colored particles are charged with a second polarity opposite to the first polarity.

18. The mobile device of claim 16, wherein a color of the charged colored particles is the same as a color of the light blocking layer.

19. The mobile device of claim 15, wherein the variable light transmission unit is formed of at least one of an electrochromic film and a polymer-dispersed liquid crystal, and the light transmissivity is increased based on the second driving voltage is applied.

20. The mobile device of claim 15, wherein the processor is configured to apply the second driving voltage, and apply the first driving voltage after applying the second driving voltage.

* * * * *